United States Patent
Wu et al.

(10) Patent No.: US 10,825,780 B2
(45) Date of Patent: Nov. 3, 2020

(54) SEMICONDUCTOR DEVICE WITH ELECTROMAGNETIC INTERFERENCE PROTECTION AND METHOD OF MANUFACTURE

(71) Applicant: Taiwan Semiconductor Manufacturing Company, Ltd., Hsin-Chu (TW)

(72) Inventors: Chi-Hsi Wu, Hsin-Chu (TW); Hsien-Wei Chen, Hsin-Chu (TW); Li-Hsien Huang, Zhubei (TW); Tien-Chung Yang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 52 days.

(21) Appl. No.: 15/364,051

(22) Filed: Nov. 29, 2016

(65) Prior Publication Data

US 2018/0151510 A1    May 31, 2018

(51) Int. Cl.
*H01L 23/552*        (2006.01)
*H01L 21/78*          (2006.01)
(Continued)

(52) U.S. Cl.
CPC ...... *H01L 23/552* (2013.01); *H01L 21/31058* (2013.01); *H01L 21/32051* (2013.01); *H01L 21/32115* (2013.01); *H01L 21/4853* (2013.01); *H01L 21/4857* (2013.01); *H01L 21/565* (2013.01); *H01L 21/6835* (2013.01); *H01L 21/78* (2013.01); *H01L 23/3114* (2013.01); *H01L 23/49822* (2013.01); *H01L 23/49838* (2013.01); *H01L 24/19* (2013.01); *H01L 24/20* (2013.01); *H01L 24/97* (2013.01); *H01L 25/0655* (2013.01); *H01L 25/0657* (2013.01); *H01L 25/105* (2013.01); *H01L 25/50* (2013.01); *H01L 21/486* (2013.01); *H01L 21/561* (2013.01); *H01L 23/3128* (2013.01); *H01L 23/49827* (2013.01); *H01L 23/5389* (2013.01);
(Continued)

(58) Field of Classification Search
CPC ............. H01L 23/552; H01L 23/49822; H01L 21/6835; H01L 21/78; H01L 23/49838; H01L 25/105; H01L 25/0655; H01L 25/0657; H01L 23/49827; H01L 24/97; H01L 23/3114; H01L 21/31058; H01L 25/50; H01L 21/486; H01L 21/4853
See application file for complete search history.

(56) References Cited

U.S. PATENT DOCUMENTS

| | | | |
|---|---|---|---|
| 7,478,474 B2 * | 1/2009 | Koga | H01L 21/561 |
| | | | 257/660 |
| 8,802,504 B1 | 8/2014 | Hou et al. | |

(Continued)

*Primary Examiner* — M. A. Golub-Miller
(74) *Attorney, Agent, or Firm* — Slater Matsil, LLP

(57) ABSTRACT

A method includes forming a first semiconductor device, wherein the first semiconductor device includes a top surface and a bottom surface, and wherein the first semiconductor device includes a metal layer having an exposed first surface. The method also includes forming a Electromagnetic Interference (EMI) layer over the top surface and sidewalls of the first semiconductor device, wherein the EMI layer electrically contacts the exposed first surface of the metal layer. The method also includes forming a molding compound over the EMI layer.

20 Claims, 18 Drawing Sheets

(51) Int. Cl.
  *H01L 23/00*    (2006.01)
  *H01L 21/3105*  (2006.01)
  *H01L 21/3205*  (2006.01)
  *H01L 21/321*   (2006.01)
  *H01L 21/48*    (2006.01)
  *H01L 21/56*    (2006.01)
  *H01L 21/683*   (2006.01)
  *H01L 23/31*    (2006.01)
  *H01L 23/498*   (2006.01)
  *H01L 25/065*   (2006.01)
  *H01L 25/10*    (2006.01)
  *H01L 25/00*    (2006.01)
  *H01L 23/538*   (2006.01)

(52) U.S. Cl.
  CPC .......... *H01L 2221/68345* (2013.01); *H01L 2221/68359* (2013.01); *H01L 2224/48091* (2013.01); *H01L 2224/48106* (2013.01); *H01L 2224/48227* (2013.01); *H01L 2225/0651* (2013.01); *H01L 2225/06537* (2013.01); *H01L 2225/06548* (2013.01); *H01L 2225/06568* (2013.01); *H01L 2225/1023* (2013.01); *H01L 2225/1058* (2013.01); *H01L 2924/15311* (2013.01); *H01L 2924/181* (2013.01)

(56) References Cited

U.S. PATENT DOCUMENTS

| | | | |
|---|---|---|---|
| 8,803,292 | B2 | 8/2014 | Chen et al. |
| 8,803,316 | B2 | 8/2014 | Lin et al. |
| 8,993,380 | B2 | 3/2015 | Hou et al. |
| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,874 | B2 | 6/2015 | Edelstein et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,299,649 | B2 | 3/2016 | Chiu et al. |
| 9,368,460 | B2 | 6/2016 | Yu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,496,189 | B2 | 11/2016 | Yu et al. |
| 2010/0072582 | A1* | 3/2010 | Chandra ............ H01L 21/561 257/659 |

* cited by examiner

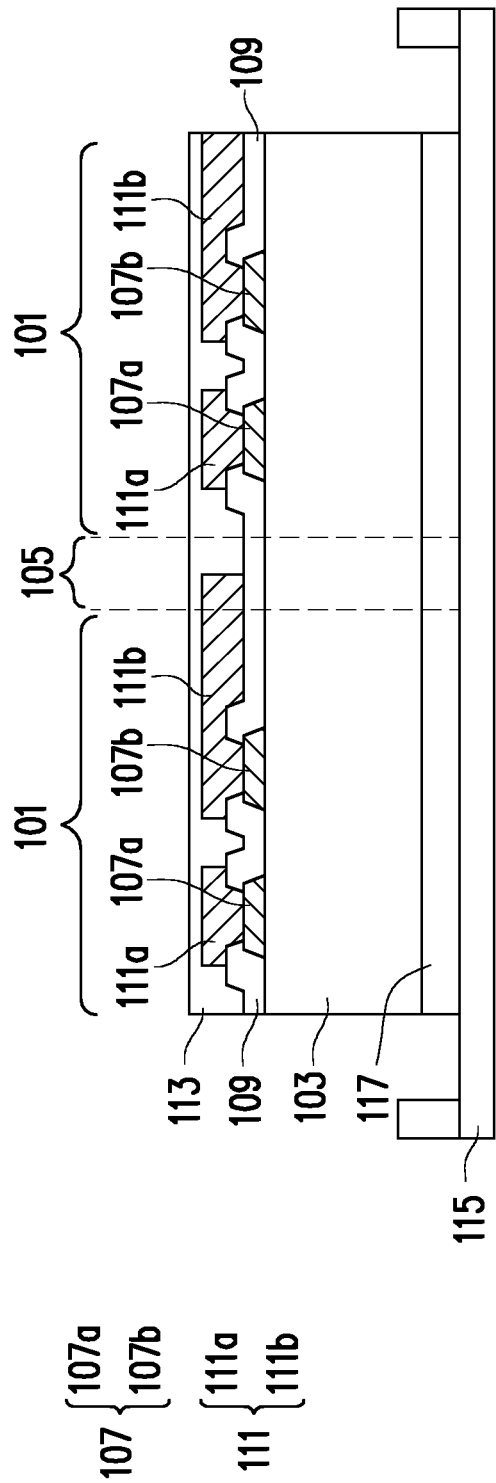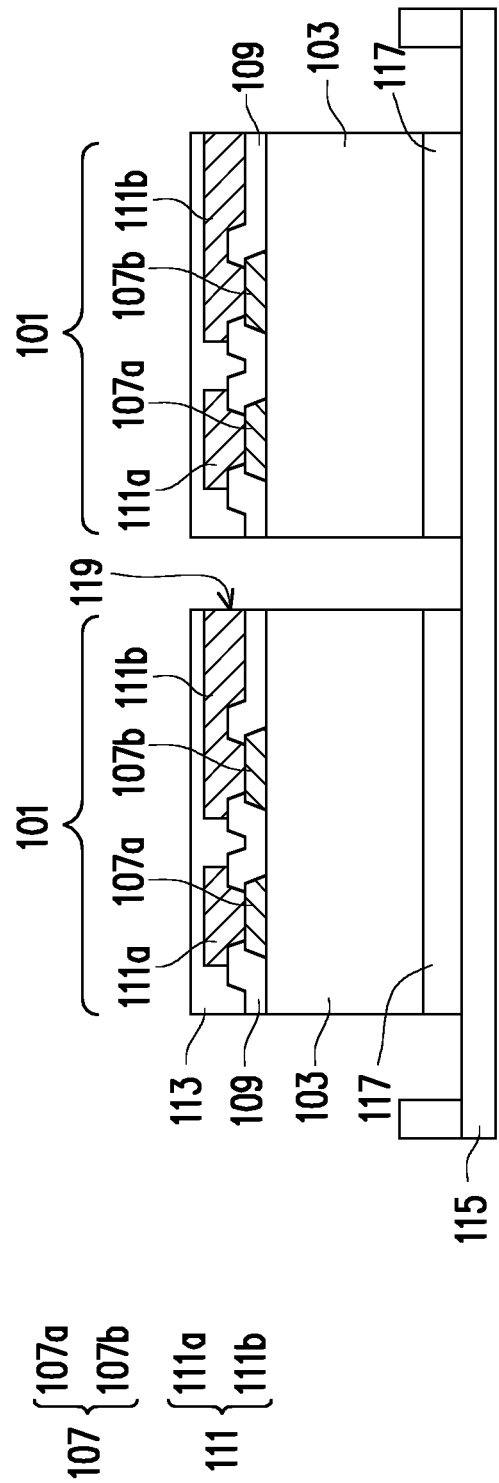

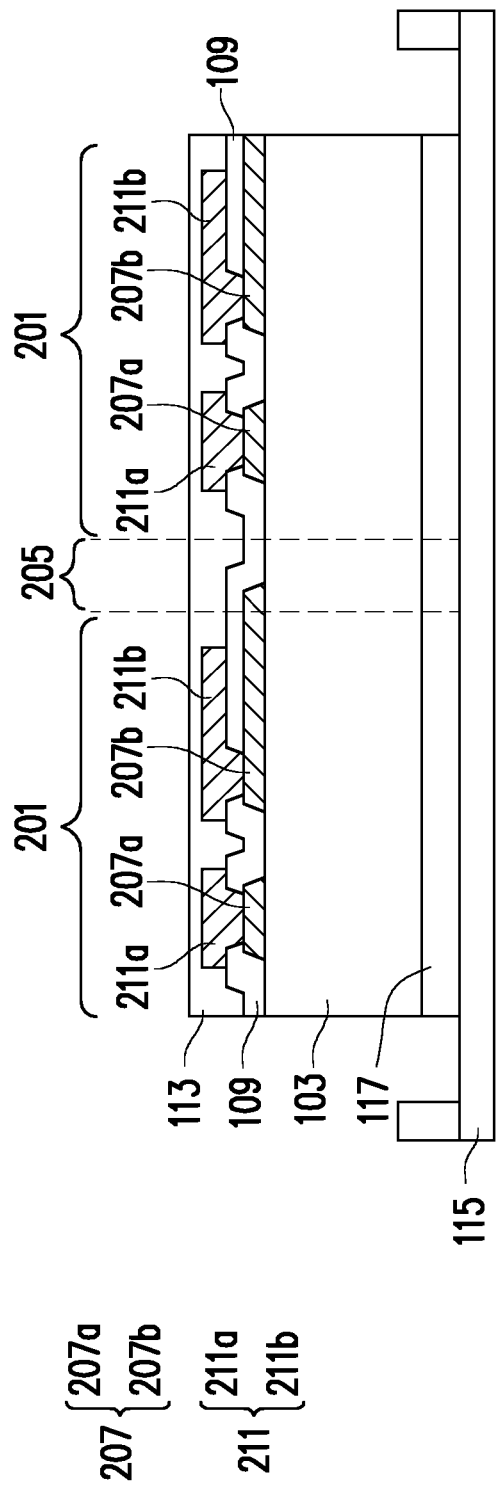
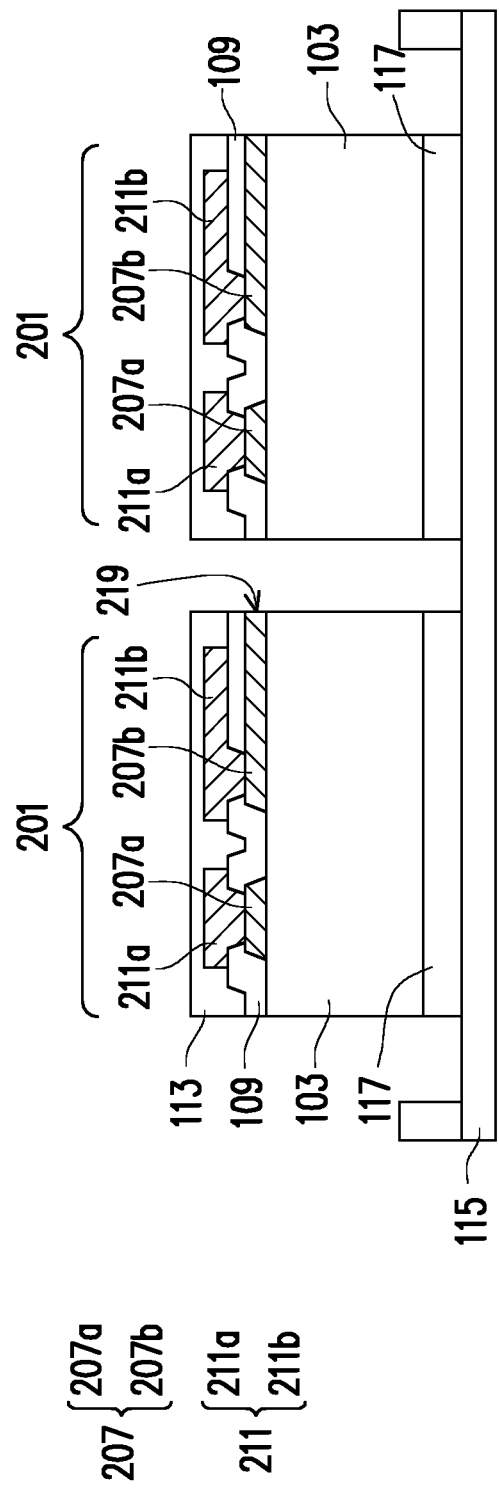
FIG. 2A
FIG. 2B

SEMICONDUCTOR DEVICE WITH ELECTROMAGNETIC INTERFERENCE PROTECTION AND METHOD OF MANUFACTURE

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1C illustrate formation of semiconductor devices with an EMI film in accordance with some embodiments.

FIGS. 2A-2C illustrate formation of semiconductor devices with an EMI film in accordance with some embodiments.

DETAILED DESCRIPTION

Figure 1C:
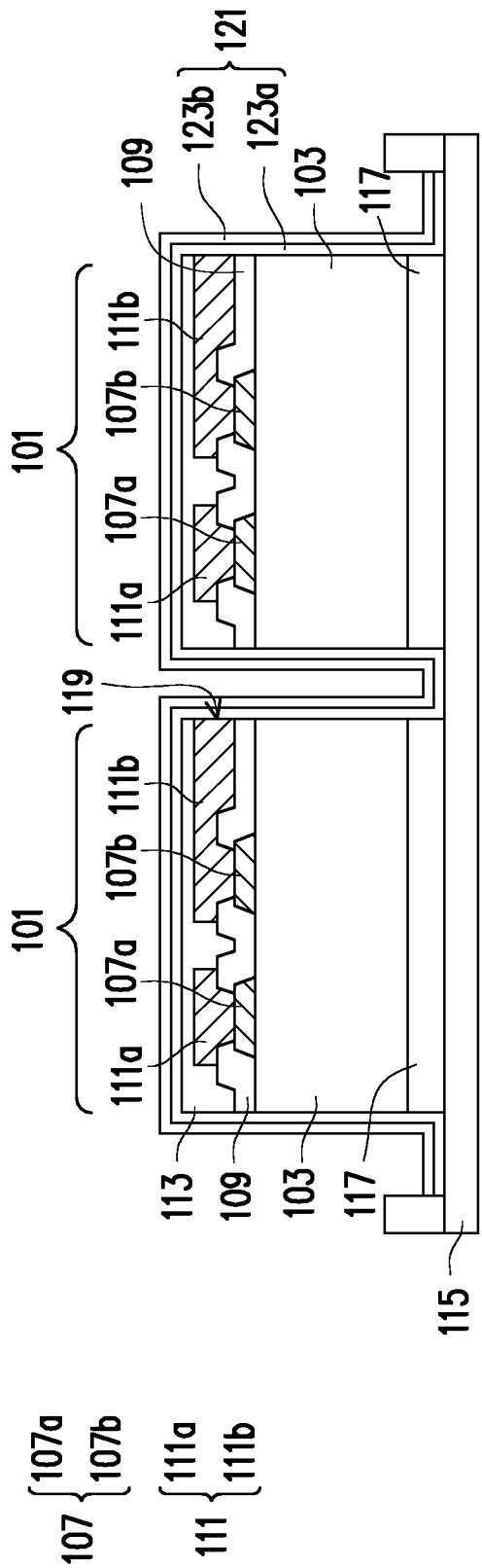

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2C:
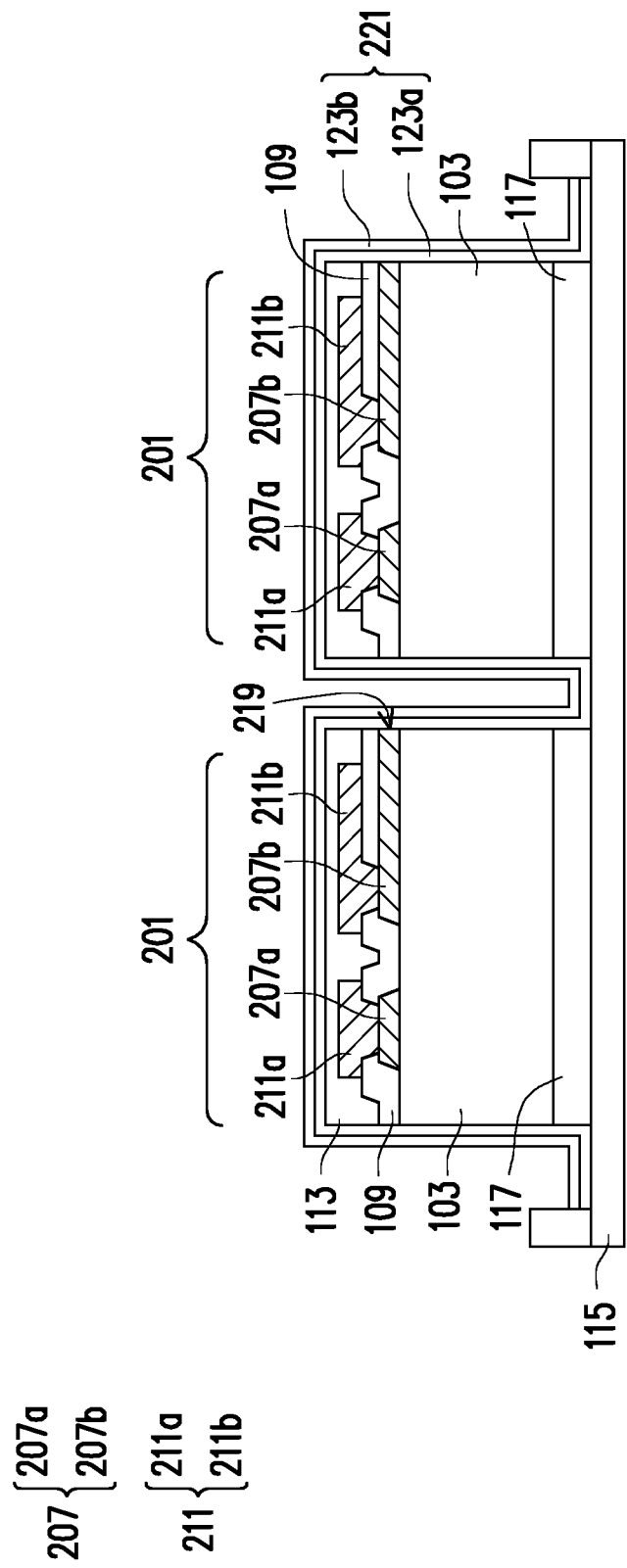

FIGS. 1A-1C illustrate the formation of some embodiments of a first semiconductor device 101 having an Electromagnetic Interference (EMI) film 121 (shown in FIG. 1C). FIGS. 2A-2C illustrate the formation of some embodiments of a second semiconductor device 201 having an Electromagnetic Interference (EMI) film 121. In some embodiments, the first semiconductor device 101 or the second semiconductor device 201 maybe incorporated into an Integrated Fan-Out (InFO) structure, an Integrated Fan-Out Package-on-Package (InFO-PoP) structure, or another type of package structure.

Referring to FIGS. 1A-1C, FIG. 1A illustrates first semiconductor devices 101 prior to singulation. Prior to singulation, each first semiconductor device 101 is separated by a scribe region 105. FIG. 1A shows two first semiconductor devices 101 as an illustrative example, and in other embodiments more than two first semiconductor devices 101 may be formed together, each separated by scribe regions 105. The first semiconductor devices 101 may be semiconductor devices designed for an intended purpose such as a memory die (e.g., a DRAM die), a logic die, an integrated circuit, a central processing unit (CPU) die, combinations of these, or the like.

In some embodiments, the first semiconductor devices 101 include a first substrate 103, first contact pads 107, first passivation layer 109, first via layer 111, and second passivation layer 113. The first substrate 103 may be a wafer or other substrate, and may be a semiconductor material such as silicon, germanium, or gallium arsenide, may be doped or undoped, or may be silicon-on-insulator (SOI), silicon dioxide ($SiO_2$) or other insulating material, or another material. Generally, an SOI substrate is a layer of a semiconductor material such as silicon, germanium, silicon germanium, SOI, silicon germanium on insulator (SGOI), or combinations thereof. The first substrate 103 may also be a multi-layered substrate, gradient substrate, hybrid orientation substrate, or another type of substrate or wafer.

In some embodiments, the first substrate 103 may include active devices (not shown) and an optional metallization layer (not shown). The active devices of the first semiconductor devices 101 may include a wide variety of active devices and passive devices such as transistors, capacitors, resistors, inductors and the like that may be used to generate the desired structural and functional features of the design for the first semiconductor devices 101. The active devices on or within the first substrate 103 may be formed using any suitable methods. The optional metallization layers (not shown) may be formed over the active devices, and are designed to connect the various active devices to form functional circuitry. In some embodiments, the metallization layers are formed of alternating layers of dielectric and conductive material and may be formed through any suitable process (such as deposition, damascene, dual damascene, etc.). In some cases, the metallization layers include one or more redistribution layers (RDL).

FIG. 1A also shows first semiconductor devices 101 mounted to a frame 115 by a first adhesive layer 117. The frame 115 may be, for example, a silicon-based material, such as glass or silicon oxide, or another material, such as aluminum oxide, metal, ceramic, polymer, combinations of any of these materials, or the like. The first adhesive layer 117 may be a die attach film (DAF) such as an epoxy resin, a phenol resin, acrylic rubber, silica filler, or a combination thereof, and may be applied using a lamination technique. However, any other suitable alternative materials and formation techniques may alternatively be used. In some embodiments, the first substrate 103 has been thinned prior to mounting on the frame 115. The thinning may be performed, e.g., using a mechanical grinding or chemical mechanical polishing (CMP) process whereby chemical etchants and abrasives are utilized to react and grind away the first substrate 103.

The first contact pads 107 may be formed over and in electrical contact with metallization layers or active devices of first semiconductor devices 101. As an illustrative example, FIGS. 1A-1C show first contact pad 107a and first contact pad 107b, collectively referred to as first contact pads 107. Other embodiments may include more or fewer first contact pads 107. In some embodiments, the first contact pads 107 are aluminum, but other conductive materials may be used such as copper, AlCu, or other materials. In some embodiments, the first contact pads 107 are formed using a deposition process, such as sputtering, to form a layer of conductive material. Portions of the layer of conductive material are then removed through a suitable process (such as photolithographic masking and etching) to form the first contact pads 107. In some embodiments, the first contact pads 107 are underbump metallization (UBMs).

The first passivation layer 109 may be formed on the first substrate 103 over any metallization layers and the first contact pads 107. The first passivation layer 109 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. In some embodiments, the first passivation layer 109 may be polybenzoxazole (PBO), although any suitable material, such as polyimide or a polyimide derivative, may be utilized. The first passivation layer 109 may be placed using, e.g., a spin-coating process. In other embodiments, the first passivation layer 109 may be formed through a process such as chemical vapor deposition (CVD). Openings in the first passivation layer 109 may be formed over the first contact pads 107 using a suitable photolithography and etching process.

The first via layer 111 is formed over the first contact pads 107 and is electrically connected to the first contact pads 107. As an illustrative example, FIGS. 1A-1C show a first via 111a formed over first contact pad 107a and a first via 111b formed over first contact pad 107b. Other embodiments of the first via layer 111 may include more or fewer first vias. The first via layer 111 may be formed to provide conductive regions for electrical contact between the first contact pads 107 and external features. For example, regions of the first via layer 111 may be connected to an RDL subsequently formed over a first semiconductor device 101. (See, for example, RDL 601a-c shown in FIGS. 6-9). The first via layer 111 may be formed from a conductive material such as copper, although other conductive materials such as nickel, gold, solder, metal alloy, combinations of these, or the like may also be used. The first via layer 111 may be formed through any suitable process (such as deposition, damascene, dual damascene, etc.). In some embodiments, the first via layer 111 may be formed using a process such as electroplating. In some embodiments, a portion of the first via layer 111 extends into the scribe region 105, as shown for first via 111b in FIG. 1A.

The second passivation layer 113 may be formed on the first passivation layer 109 and the first via layer 111. The second passivation layer 113 may formed from a material or from a process described above with respect to first passivation layer 109. The second passivation layer 113 may be the same material as or a different material than first passivation layer 109. In some embodiments, the first semiconductor device 101 may have more passivation layers and/or metallization layers, and in some embodiments, the first semiconductor device 101 may have fewer passivation layers and/or metallization layers.

FIG. 1B illustrates first semiconductor devices 101 after a singulation process. The singulation process removes the scribe region 105 and separates the first semiconductor devices 101. In some embodiments, the singulation process may be performed by using a saw blade to slice through the substrate 103, the first passivation layer 109, and the second passivation layer 113. The singulation process may also slice through some or all of the first adhesive layer 117. As shown in FIGS. 1A-1B, the singulation process also slices through the portion of the first via layer 111 that extends into the scribe region 105, exposing a sidewall of the first via layer 111. An example exposed sidewall 119 of first via 111b is indicated in FIG. 1B, though other embodiments may include more than one exposed sidewall. After singulation, the exposed sidewall of the first via layer 111 may be substantially coplanar with a sidewall of the substrate 103. As one of ordinary skill in the art will recognize, utilizing a saw blade for the singulation process is merely one illustrative embodiment and is not intended to be limiting. Any suitable technique may be used for performing the first singulation process, such as utilizing one or more etches. These and any other suitable techniques may be used to singulate the first semiconductor devices 101.

FIG. 1C illustrates an EMI film 121 formed over the singulated first semiconductor devices 101. In some embodiments, EMI film 121 is formed from a single conformal layer of material, and in some embodiments, EMI film 121 is formed from multiple conformal layers of materials. EMI film 121 is formed over the first semiconductor devices 101 to shield the first semiconductor devices 101 from electromagnetic interference.

In some embodiments, EMI film 121 is formed from an adhesion layer 123a and a conduction layer 123b. The adhesion layer 123a is formed conformally over the exposed surfaces of the first semiconductor devices 101. The adhesion layer 123a may improve adhesion of the conduction layer 123b to the first semiconductor devices 101. In some embodiments the adhesion layer 1203 may be a conductive metal such as stainless steel (SUS), titanium, or another conductive metal. The adhesion layer 123a may be formed using a suitable technique, for example a deposition process such as sputtering, physical vapor deposition (PVD), chemical vapor deposition (CVD), atomic layer deposition (ALD), spray coating, electroless plating, or the like. In some embodiments, the adhesion layer 123a is formed having a thickness of between about 0.05 μm and about 1 μm, such as about 0.1 μm.

The conduction layer 123b is formed conformally over the adhesion layer 123a. In some embodiments, conduction layer 123b may be a material such as copper, silver, a palladium/copper alloy, or the like. The conduction layer 123b may be formed using a process such as sputtering, PVD, CVD, ALD, plating, or spraying. In some embodiments, the conduction layer 123b is formed having a thickness of between about 1 µm and about 100 µm, such as about 10 µm.

In some embodiments, the EMI film 121 includes an additional protection layer (e.g., an SUS layer) formed over the conduction layer 123b to protect the conduction layer 123b. In some embodiments, the EMI film 121 does not include an additional protection layer formed over the conduction layer 123b. For example, in some embodiments, a molding compound, encapsulant, or underfill is formed directly over the conduction layer 123b and protects the conduction layer 123b. In embodiments such as these, an additional protection layer over the conduction layer 123b may not be needed. See, for example, FIGS. 5-9 in which a molding compound is formed directly over the EMI film 121, discussed in greater detail below.

As the first via 111b of first via layer 111 has an exposed sidewall 119, the EMI film 121 may make physical contact and electrical contact to the first via 111b through the exposed sidewall 119. In this manner, the EMI film 121 may be electrically connected to a voltage of a first semiconductor device 101 at first via 111b. For example, the EMI film 121 may be electrically connected to a reference voltage or a ground of a first semiconductor device 101 through first via 111b. In other embodiments, the EMI film 121 may be connected to a first semiconductor device 101 through exposed sidewalls of multiple first vias or other conductive features. By electrically connecting the EMI film 121 to the device, the electromagnetic shielding from the EMI film 121 may be improved.

After deposition of the EMI film 121, each first semiconductor device 101 may be removed from the frame 115 and incorporated into a package such as an Integrated Fan-Out (InFO) structure, an Integrated Fan-Out Package-on-Package (InFO-PoP) structure, or another type of package structure. The first semiconductor device 101 may be removed from the frame 115 by a suitable process such as a pick-and-place process. In some cases, the pick-and-place process may sever the portions of the EMI film 121 attached to the first semiconductor device 101 from portions of the EMI film 121 attached to the frame 115.

However, as one of ordinary skill in the art will recognize, the above described process to form semiconductor device 101 is merely one such description, and is not meant to limit the embodiments to this exact process. Rather, the described process is intended to be merely illustrative, as any suitable process for forming semiconductor device 101 may alternatively be utilized. All suitable processes are fully intended to be included within the scope of the present embodiments.

Turning now to FIGS. 2A-2C, the second semiconductor devices 201 are similar to the first semiconductor devices 101. The second semiconductor devices 201 may be semiconductor devices designed for an intended purpose such as a memory die (e.g., a DRAM die), a logic die, an integrated circuit, a central processing unit (CPU) die, combinations of these, or the like. However, the first via layer 211 of the second semiconductor devices 201 does not extend into scribe region 205. Additionally, first contact pads 207 are formed such that a first contact pad 207 extends into scribe region 215, as shown for first contact pad 207b in FIG. 2A. Thus, the first contact pad 207b will have an exposed sidewall 219 after singulation, as shown in FIG. 2B. After singulation, the exposed sidewall of the first contact pad 207b may be substantially coplanar with a sidewall of the substrate 103. FIG. 2C illustrates the second semiconductor devices 201 after a conformal EMI film 221 has been formed over the surfaces of the second semiconductor devices 201. The EMI film 221 may be similar to the EMI film 221 described above with respect to FIG. 1C. For example, the EMI film 221 may be formed from an adhesion layer 123a and a conduction layer 123b.

As the first contact pad 207b has an exposed sidewall 219, the EMI film 221 may make physical contact and electrical contact to the first contact pad 207b through the exposed sidewall 219. In this manner, the EMI film 221 may be electrically connected to a voltage of a second semiconductor device 201 at first contact pad 207b. In other embodiments, the EMI film 221 may be connected to a second semiconductor device 201 through exposed sidewalls of multiple first contact pads 207. In other embodiments, the EMI film 221 may be connected to a second semiconductor device 201 through exposed sidewalls of one or more first contact pads 207 and through exposed sidewalls of one or more first vias (as described above with respect to FIG. 1C). By electrically connecting the EMI film 221 to the device, the electromagnetic shielding from the EMI film 221 may be improved.

Figure 3:
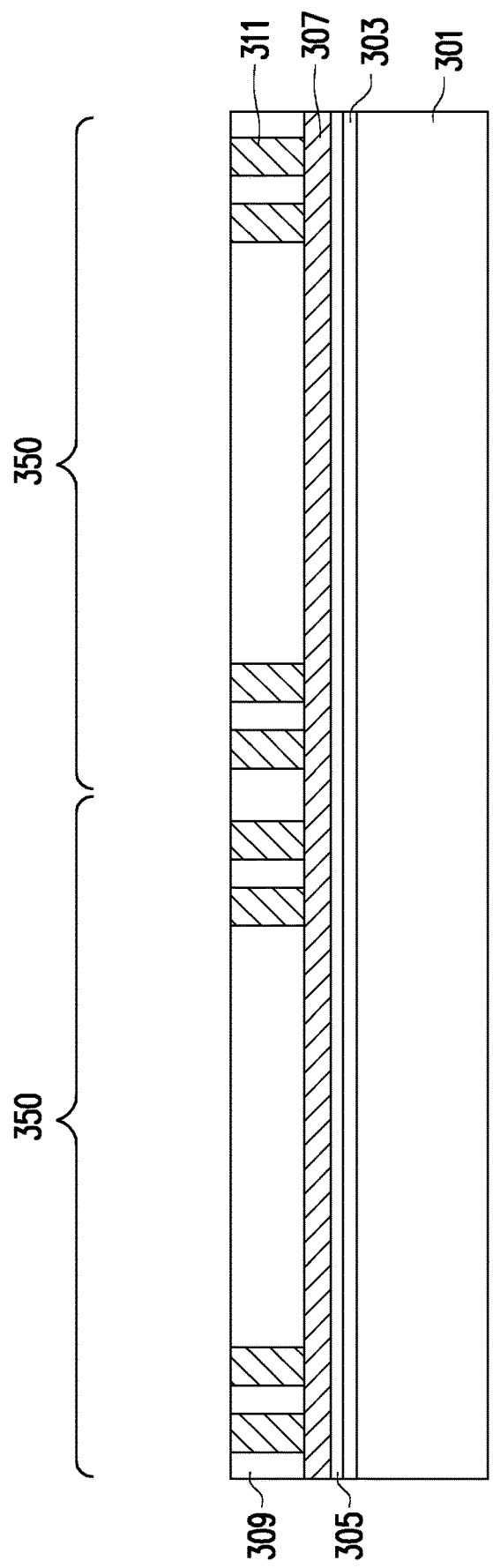
FIGS. 3-9 illustrates formation of InFO-POP structures in accordance with some embodiments.

FIGS. 3-9 show the formation of some embodiments of an InFO-PoP structure 350. The InFO-PoP structure 350 may include one or more semiconductor devices like those described above with respect to FIGS. 1A-1C and 2A-2C. With reference now to FIG. 3, there is shown a first carrier substrate 301 with a second adhesive layer 303, a first polymer layer 305, and a first seed layer 307 over the first carrier substrate 301. Regions 350 have been indicated where individual InFO-PoP structures 350 will be formed. The first carrier substrate 301 may be a silicon-based material such as glass or silicon oxide, another material such as aluminum oxide, combinations of these materials, or the like. The first carrier substrate 301 is planar within process variations in order to accommodate an attachment of semiconductor devices such as the first semiconductor device 101, the second semiconductor device 201, or one or more other semiconductor devices (not illustrated in FIG. 3 but illustrated and discussed below with respect to FIGS. 4-9).

The second adhesive layer 303 is formed on the first carrier substrate 301 in order to assist in the adherence of overlying structures (e.g., the first polymer layer 305). In some embodiments, the second adhesive layer 303 may comprise an ultraviolet glue, which loses its adhesive properties when exposed to ultraviolet light. However, other types of adhesives, such as pressure sensitive adhesives, radiation curable adhesives, epoxies, combinations of these, or the like, may also be used. The second adhesive layer 303 may be formed onto the first carrier substrate 301 in a semi-liquid or gel form which is readily deformable under pressure.

The first polymer layer 305 is placed over the second adhesive layer 303 and may provide protection to attached semiconductor devices. In some embodiments, the first polymer layer 305 may be polybenzoxazole (PBO), although any suitable material, such as polyimide or a polyimide derivative, Solder Resistance (SR), or Ajinomoto build-up film (ABF) may alternatively be utilized. The first polymer layer 305 may be placed using, e.g., a spin-coating process to a thickness of between about 2 µm and about 15 µm, such as about 5 µm, although any suitable method and thickness may alternatively be used.

The first seed layer 307 is formed over the first polymer layer 305. In some embodiments, the first seed layer 307 is a thin layer of a conductive material that aids in the formation of a thicker layer during subsequent processing steps. In some embodiments, the first seed layer 307 is a layer of titanium about 1,000 Å thick covered by a layer of copper about 5,000 Å thick. The first seed layer 307 may be formed using a process such as sputtering, evaporation, a PECVD process, or another process. In some embodiments, the first seed layer 307 may have a thickness of between about 0.3 μm and about 1 μm, such as about 0.5 μm.

FIG. 3 also illustrates the formation and patterning of a photoresist 309 over the first seed layer 307. In some embodiments, the photoresist 309 may be formed on the first seed layer 307 using a spin coating technique or another technique. In some embodiments, the photoresist 309 is formed to a thickness between about 50 μm and about 250 μm, such as about 120 μm. The photoresist 309 may be patterned by one or more suitable photolithography techniques.

In some embodiments, the pattern formed into the photoresist 309 is a pattern for forming vias 311. The vias 311 may be located on different sides of subsequently attached semiconductor devices as shown in FIGS. 4-9, though in other embodiments the vias 311 may be located in any suitable arrangement. In some embodiments, the vias 311 are formed within the photoresist 309 from one or more conductive materials, such as copper, tungsten, other conductive metals, or the like. The vias 311 may be formed, for example, by electroplating, electroless plating, or the like.

After the vias 311 have been formed, the photoresist 309 may be removed using a suitable removal process (not illustrated in FIG. 3 but seen in FIG. 4 below). The photoresist may be removed using a suitable removal process such as plasma ashing, wet strip or any other suitable process. The removal of the photoresist 309 may expose the underlying portions of the first seed layer 307.

The exposed portions of the first seed layer 307 may be removed (not illustrated in FIG. 3 but seen in FIG. 4 below). In some embodiments, the exposed portions of the first seed layer 307 (e.g., those portions that are not covered by the vias 311) may be removed by a wet or dry etching process, or another suitable process. After the exposed portion of the first seed layer 307 has been removed, a portion of the first polymer layer 305 is exposed between the vias 311.

Figure 4:
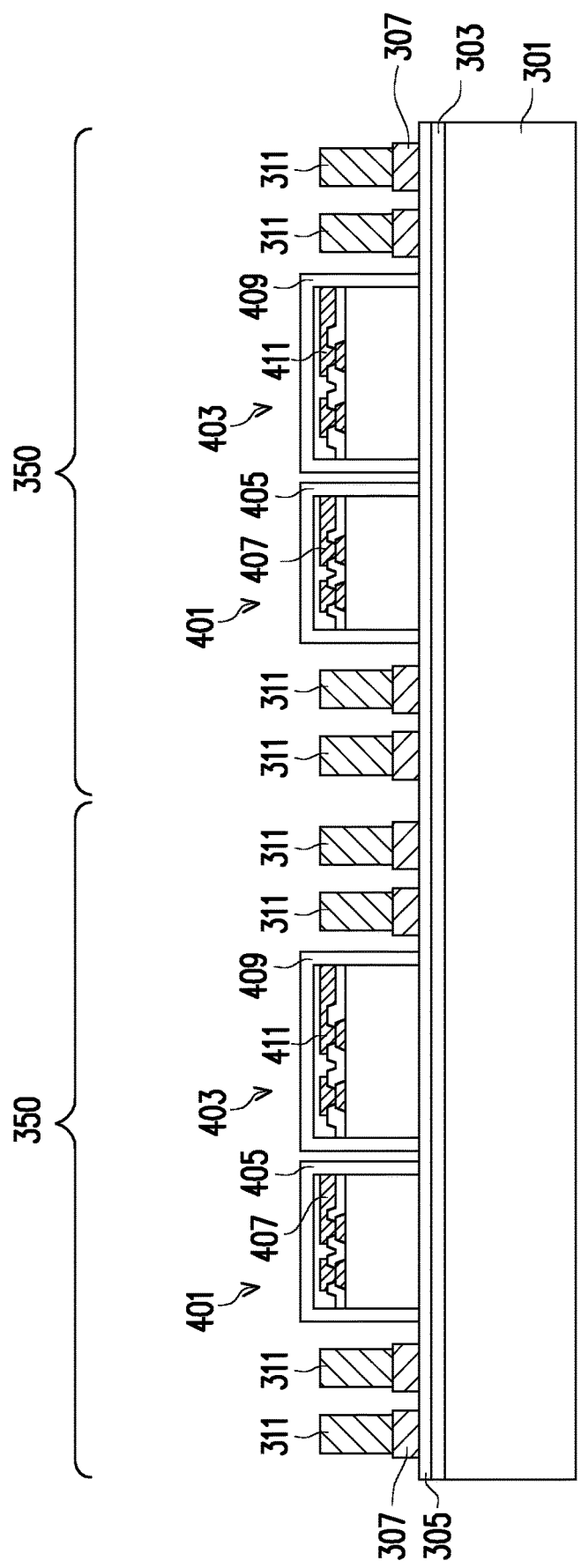

FIG. 4 illustrates a third semiconductor device 401 and a fourth semiconductor device 403 placed onto the polymer layer 305. The third semiconductor device 401 or the fourth semiconductor device 403 may be a semiconductor device designed for an intended purpose such as a memory die (e.g., a DRAM die), a logic die, an integrated circuit, a central processing unit (CPU) die, combinations of these, or the like. In some embodiments, the third semiconductor device 401 and the fourth semiconductor device 403 are similar to the first semiconductor device 101 and/or second semiconductor device 201 described previously. For example, the third semiconductor device 401 may be covered by an EMI film 405 that is connected to a first via 407, and the fourth semiconductor device 403 may be covered by an EMI film 409 that is connected to a first via 411. The EMI film 405 or the EMI film 409 may be similar to or different from EMI film 121 described above. In some embodiments, one semiconductor device or more than two semiconductor devices are placed within each InFO-PoP structure. In some embodiments, one or more of the semiconductor devices may not be covered in an EMI film or may not have a first via or a contact pad connected to an EMI film. The third semiconductor device 401 or the fourth semiconductor device 403 may be attached to the polymer layer 305 by an adhesive layer (not shown). The adhesive layer may be formed on the third semiconductor device 401 and/or the fourth semiconductor device 403, and the adhesive layer may be similar to the first adhesive layer 117 shown in FIGS. 1A-2C. In some embodiments, the semiconductor devices may be placed onto the first polymer layer 305 using a pick-and-place process. However, any other suitable method of placing semiconductor devices may be used.

Figure 5:
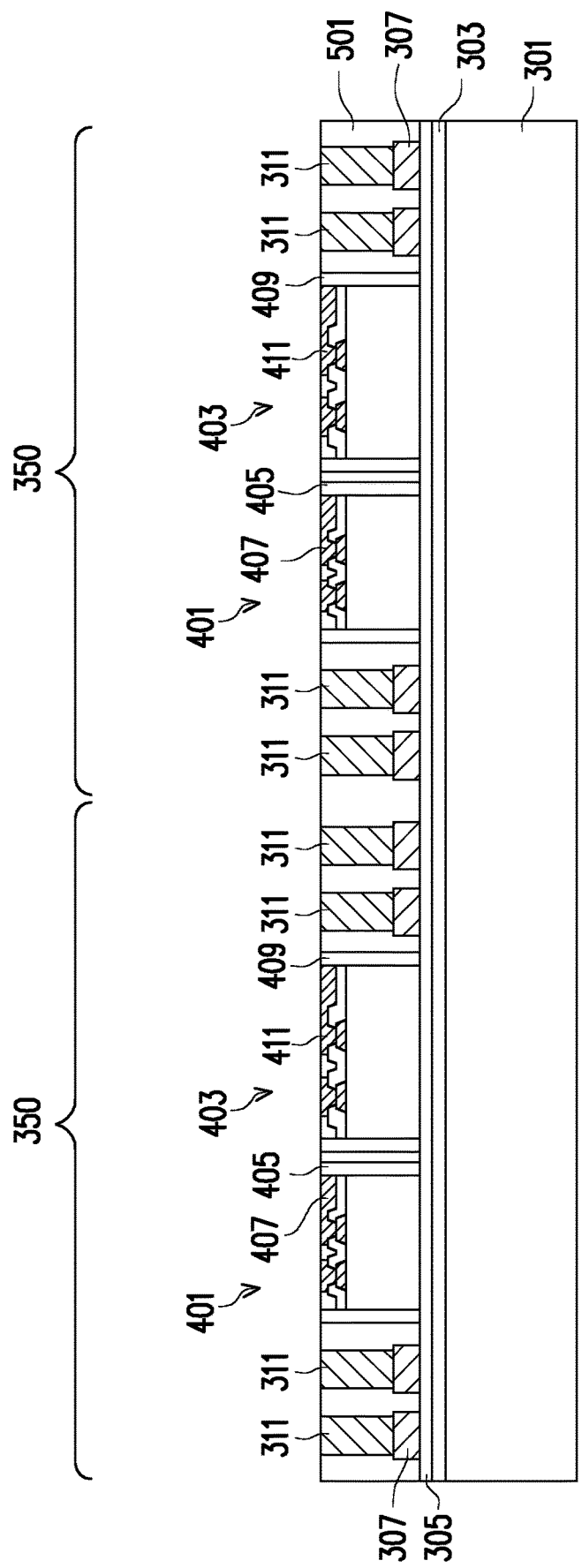

FIG. 5 illustrates an encapsulation and planarization of the vias 311, the third semiconductor device 401 and the fourth semiconductor device 403. A first encapsulant 501 may be formed over the vias 311, the third semiconductor device 401 and the fourth semiconductor device 403 using any suitable method. The first encapsulant 501 may be a molding compound resin such as polyimide, PPS, PEEK, PES, a heat resistant crystal resin, combinations of these, or the like. In some embodiments, the first encapsulant 501 is cured after formation.

FIG. 5 also illustrates a planarization of the first encapsulant 501. The planarization may be performed using a mechanical grinding process, a chemical mechanical polishing (CMP) process, or another process. In some embodiments, the planarization may grind away the first encapsulant 501, portions of the vias 311, the top surface of EMI film 405 of the third semiconductor device 401 and portions of the third semiconductor device 401, and the top surface of EMI film 409 of the fourth semiconductor device 403 and portions of the fourth semiconductor device 403. The planarization exposes top surfaces of the vias 311, first vias 407 of the third semiconductor device 401, and first vias 411 of the fourth semiconductor device 403 for further processing. As such, the vias 311, the third semiconductor device 401, and the fourth semiconductor device 403 may have a planar surface that is also planar with the first encapsulant 501, as shown in FIG. 5. As shown in FIGS. 5-9, in some embodiments the first encapsulant 501 covers and protects the EMI films covering the semiconductor devices.

Figure 6:
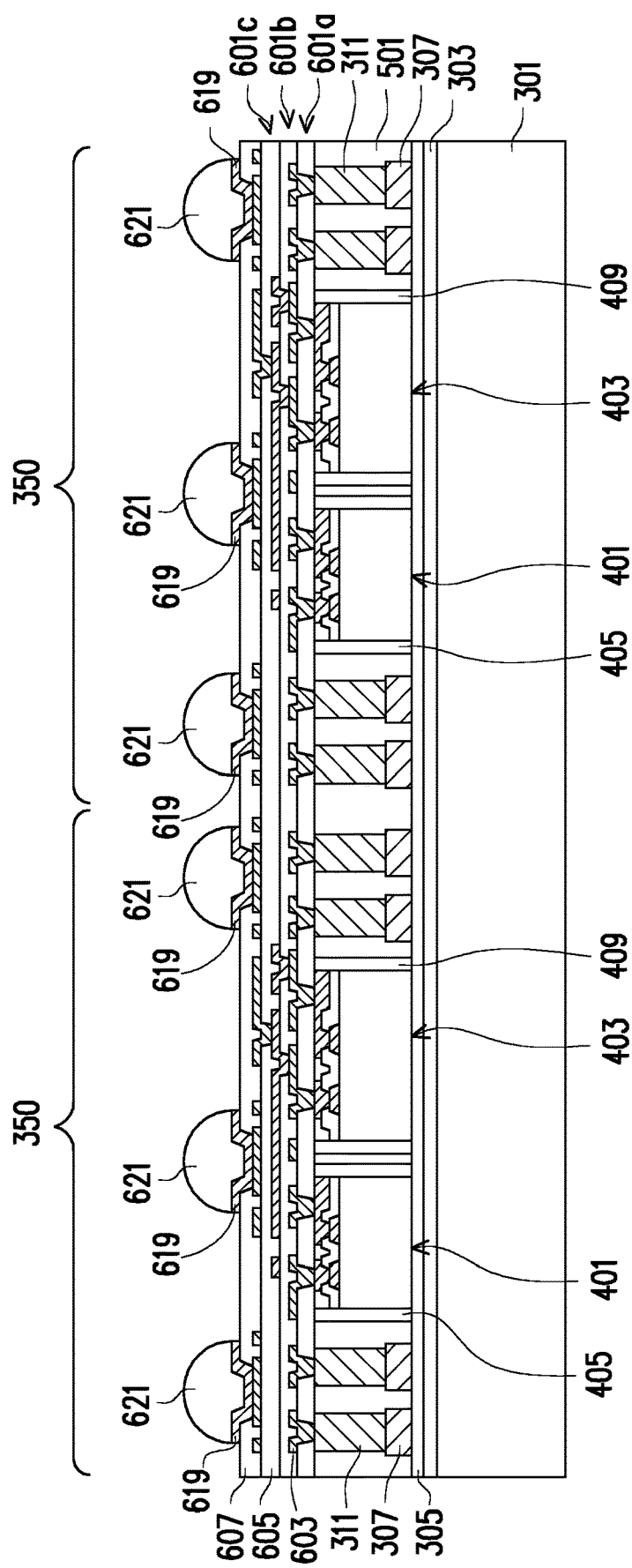

FIG. 6 illustrates a formation of redistribution layers (RDL) 601a-c over the vias 311, the third semiconductor device 401, and the fourth semiconductor device 403 in order to connect the vias 311, the third semiconductor device 401, the fourth semiconductor device 403, and external connections 621. For example, the RDL 601a-c may connect the vias 311 to the external connections 621, the vias 311 to the third semiconductor device 401 and/or the fourth semiconductor device 403, the external connections 621 to the third semiconductor device 401 and/or the fourth semiconductor device 403, and/or the third semiconductor device 401 to the fourth semiconductor device 403. FIG. 6 is an illustrative cross-sectional view of the RDL 601a-c, and thus may not show all features of the RDL 601a-c, as some features may not be present in the example cross-section. For example, the cross-section shown in FIG. 601 may not show all conductive features of the RDL 601a-c and may not show all interconnections between conductive features. The RDL 601a-c shown in FIGS. 6-9 include 3 RDL layers 601a, 601b and 601c, but in other embodiments, the RDL 601a-c may include more or fewer RDL layers. In some embodiments, the RDL 601a-c are formed of alternating layers of insulating material and conductive material and may be formed through any suitable process. An example insulating layer 605 and an example conductive material layer 603 are indicated in FIG. 6.

A passivation layer 607 may be formed over the topmost RDL layer 601c of RDL 601a-c. In some embodiments, the passivation layer 607 may be a polymer such as PBO, a polyimide, a polyimide derivative, or another dielectric material. Openings may be made through the passivation layer 607 to expose portions of the topmost RDL layer 601c. The openings in the passivation layer 607 allow for contact between the topmost RDL layer 601c and Underbump Metallizations (UBMs) 619. The openings may be formed using a suitable photolithographic mask and etching process, although any suitable process may be used.

The UBMs 619 may be created by forming one or more conductive layers over the passivation layer 607 and along the interior of the opening through the passivation layer 607. The forming of each conductive layer may be performed using a plating process, such as electrochemical plating, although other processes of formation, such as sputtering, evaporation, or PECVD process. Once the desired layers have been formed, portions of the layers may then be removed through a suitable photolithographic masking and etching process to remove excess material. The external connections 621 are formed on the UBMs 619 and may provide external electrical connection points to topmost RDL layer 601c. The external connections 621 may be, for example, contact bumps, solder bumps, or another type of connection feature.

Figure 7:
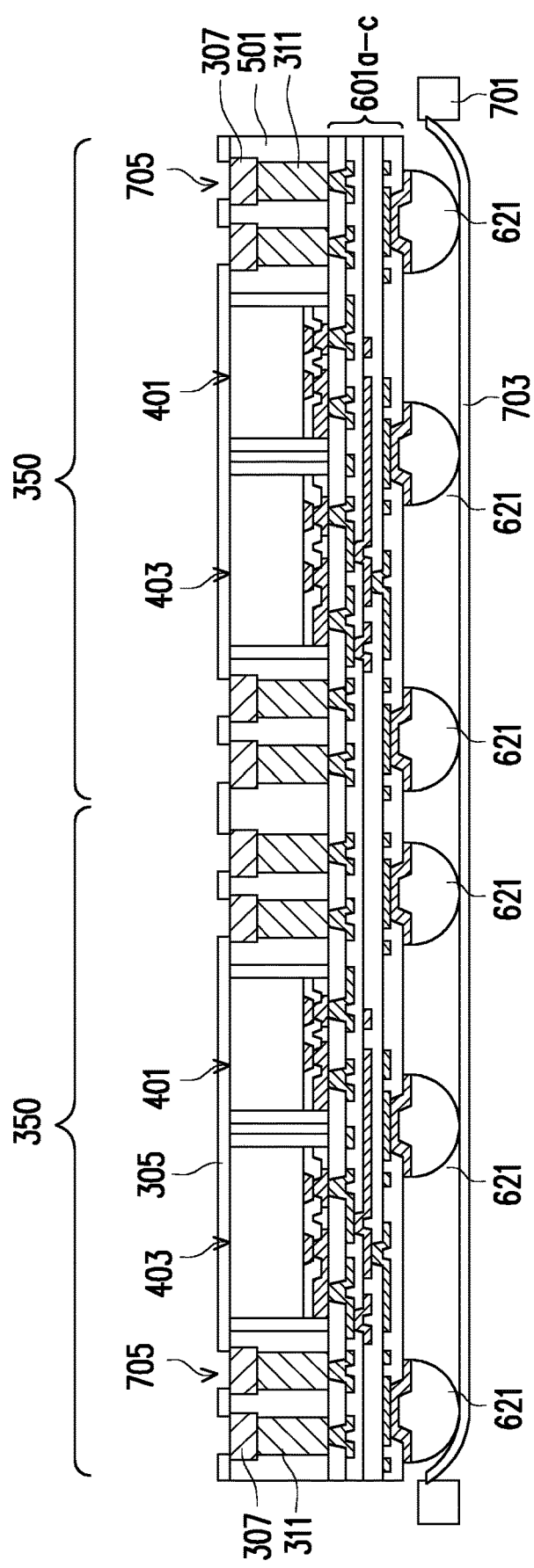

FIG. 7 illustrates a debonding of the first carrier substrate 301 from the vias 311, the third semiconductor devices 401, and the fourth semiconductor devices 403. In some embodiments, the external connections 621 may be attached to a ring structure 701. The ring structure 701 may be a metal ring intended to provide support and stability for the structure during and after the debonding process. In some embodiments, the external connections 621 are attached to the ring structure 701 using an ultraviolet tape 703, although any other suitable adhesive, tape, frame, or attachment may be used. Once the external connections 621 are attached to the ring structure 701, the first carrier substrate 301 may be debonded from the first polymer layer 305. FIG. 7 also illustrates a patterning of the first polymer layer 305 to form openings 705 and expose the first seed layers 307 of the vias 311. In some embodiments, the first polymer layer 305 may be patterned using laser drilling, photolithographic techniques, or another technique.

Figure 8:
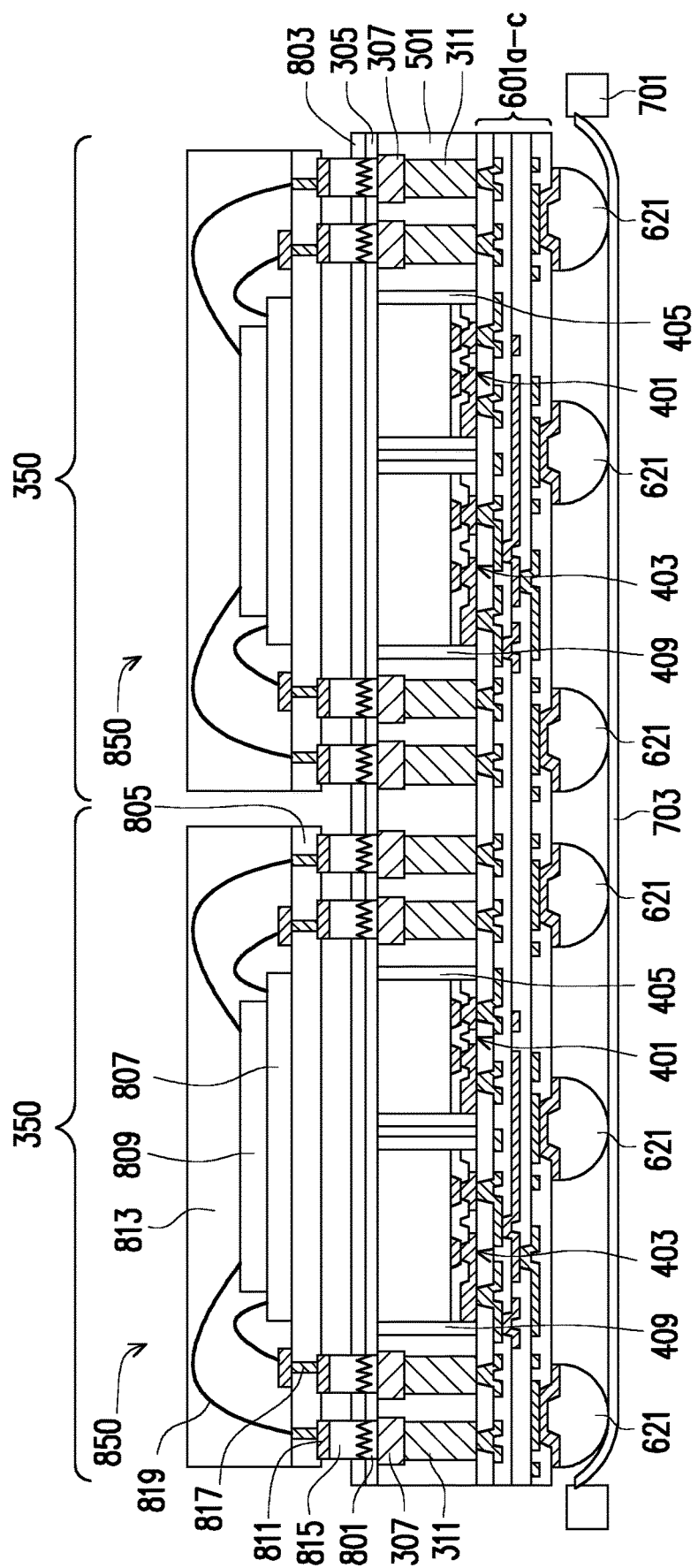

FIG. 8 illustrates backside ball pads 801 placed within the openings 705 in order to protect the exposed vias 311. In some embodiments, the backside ball pads 801 may comprise a conductive material such as solder on paste or an oxygen solder protection (OSP), although any suitable material may be used. In some embodiments, the backside ball pads 801 may be applied using a stencil or another technique, and then the backside ball pads 801 may be reflowed to form a bump shape.

FIG. 8 also illustrates the formation and patterning of a backside protection layer 803 over the backside ball pads 801, effectively sealing the joint between the backside ball pads 801 and the vias 311 from moisture. In some embodiments, the backside protection layer 803 may be a protective material such as a PBO, Solder Resistance (SR), Lamination Compound (LC) tape, Ajinomoto build-up film (ABF), non-conductive paste (NCP), non-conductive film (NCF), patterned underfill (PUF), warpage improvement adhesive (WIA), liquid molding compound V9, combinations of these, or the like. However, any suitable material may also be used. The backside protection layer 803 may be applied using a process such as screen printing, lamination, spin coating, or the like. After formation, the backside protection layer 803 may be patterned to expose the backside ball pads 801. The backside protection layer 803 may be patterned using laser drilling, photolithographic techniques, or other suitable techniques.

FIG. 8 also illustrates the backside ball pads 801 bonded to a first package 850. In some embodiments the first package 850 may comprise a second substrate 805, a fifth semiconductor device 807, a sixth semiconductor device 809 (bonded to the fifth semiconductor device 807), second contact pads 811, second encapsulant 813, and second external connections 815. In some embodiments, the second substrate 805 may be a packaging substrate including through substrate vias 817 to connect the fifth semiconductor device 807 and the sixth semiconductor device 809 to the backside ball pads 801. In some embodiments, the second substrate 805 may be an interposer, a silicon substrate, doped or undoped, or an active layer of a silicon-on-insulator (SOI) substrate. The second substrate 805 may also be a glass substrate, a ceramic substrate, a polymer substrate, or any other substrate that may provide a suitable protection and/or interconnection functionality.

The a fifth semiconductor device 807 may be a semiconductor device designed for an intended purpose such as a memory die (e.g., a DRAM die), a logic die, a central processing unit (CPU) die, combinations of these, or the like. In some embodiments, the fifth semiconductor device 807 includes integrated circuit devices, such as transistors, capacitors, inductors, resistors, first metallization layers (not shown), and the like. In some embodiments, the fifth semiconductor device 807 is designed and manufactured to work in conjunction with or concurrently with the third semiconductor device 401 or the fourth semiconductor device 403.

The sixth semiconductor device 809 may be similar to the fifth semiconductor device 807. For example, the sixth semiconductor device 809 may be a semiconductor device designed for an intended purpose (e.g., a DRAM die) and comprising integrated circuit devices for a desired functionality. In some embodiments the sixth semiconductor device 809 is designed to work in conjunction with or concurrently with the third semiconductor device 401 or the fourth semiconductor device 403.

The sixth semiconductor device 809 may be bonded to the fifth semiconductor device 807. In some embodiments the sixth semiconductor device 809 is only physically bonded with the fifth semiconductor device 807, such as by using an adhesive. In this embodiment the sixth semiconductor device 809 and the fifth semiconductor device 807 may be electrically connected to the second substrate 805 using wire bonds 819, although any suitable electrical bonding may be alternatively be utilized.

Alternatively, the sixth semiconductor device 809 may be bonded to the fifth semiconductor device 807 both physically and electrically. In this embodiment the sixth semiconductor device 809 may comprise sixth external connections (not separately illustrated in FIG. 8) that connect with seventh external connections (also not separately illustrated in FIG. 8) on the fifth semiconductor device 807 in order to interconnect the sixth semiconductor device 809 with the fifth semiconductor device 807.

The second contact pads 811 may be formed on the second substrate 805 to form electrical connections between the fifth semiconductor device 807 and the second external connections 815. In some embodiments, the second contact pads 811 may be formed over and in electrical contact with electrical routing (such as through substrate vias 817) within second substrate 805.

The second encapsulant 813 may be used to encapsulate and protect the fifth semiconductor device 807, the sixth semiconductor device 809, and the second substrate 805. In some embodiments, the second encapsulant 813 may be a molding compound resin such as polyimide, PPS, PEEK, PES, a heat resistant crystal resin, combinations of these, or the like. In some embodiments, the second encapsulant 813 may be cured after formation.

In some embodiments, the second external connections 815 may be formed to provide an external connection between the second substrate 805 and the backside ball pads 801. The second external connections 815 may be contact bumps such as microbumps or controlled collapse chip connection (C4) bumps and may comprise a material such as tin, silver, copper, or another suitable material. After the second external connections 815 have been formed, the second external connections 815 are aligned with and placed into physical contact with the backside ball pads 801, and a bonding process is performed. For example, in some embodiments in which the second external connections 815 are solder bumps, the bonding process may comprise a reflow process.

Figure 9:
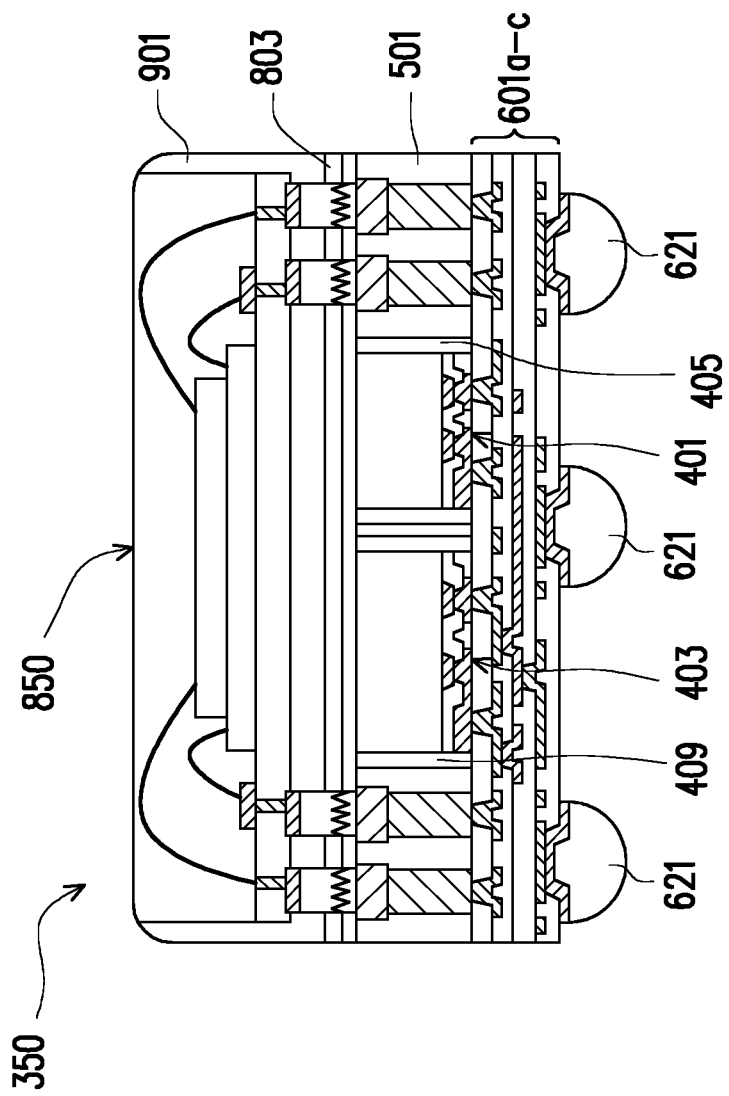

FIG. 9 illustrates InFO-PoP structure 350 after debonding from the ring structure 701 and singulation. Prior to debonding and singulation, an underfill material 901 may be injected or otherwise formed in the space between adjacent first packages 850 and in the space between first packages 850 and the backside protection layer 803. In some embodiments, the underfill material 901 may be a liquid epoxy that is dispensed between first packages 850 and the backside protection layer 803, and then cured to harden. In some embodiments, a second EMI film (not shown) may be formed over the InFO-PoP structure 350.

However, as one of ordinary skill in the art will recognize, the above described process to form the InFO-PoP structure 350 is merely one such description, and is not meant to limit the embodiments to this exact process. Rather, the described process is intended to be merely illustrative, as any suitable process for forming and packaging semiconductor devices with EMI films such as first semiconductor device 101, second semiconductor device 201, third semiconductor device 401, or fourth semiconductor device 403 may alternatively be utilized. In some embodiments, semiconductor devices with EMI films such as first semiconductor device 101, second semiconductor device 201, third semiconductor device 401, or fourth semiconductor device 403 may be incorporated into an InFO structure without vias 311. All suitable processes, packages, and structures are fully intended to be included within the scope of the present embodiments.

Figure 10:
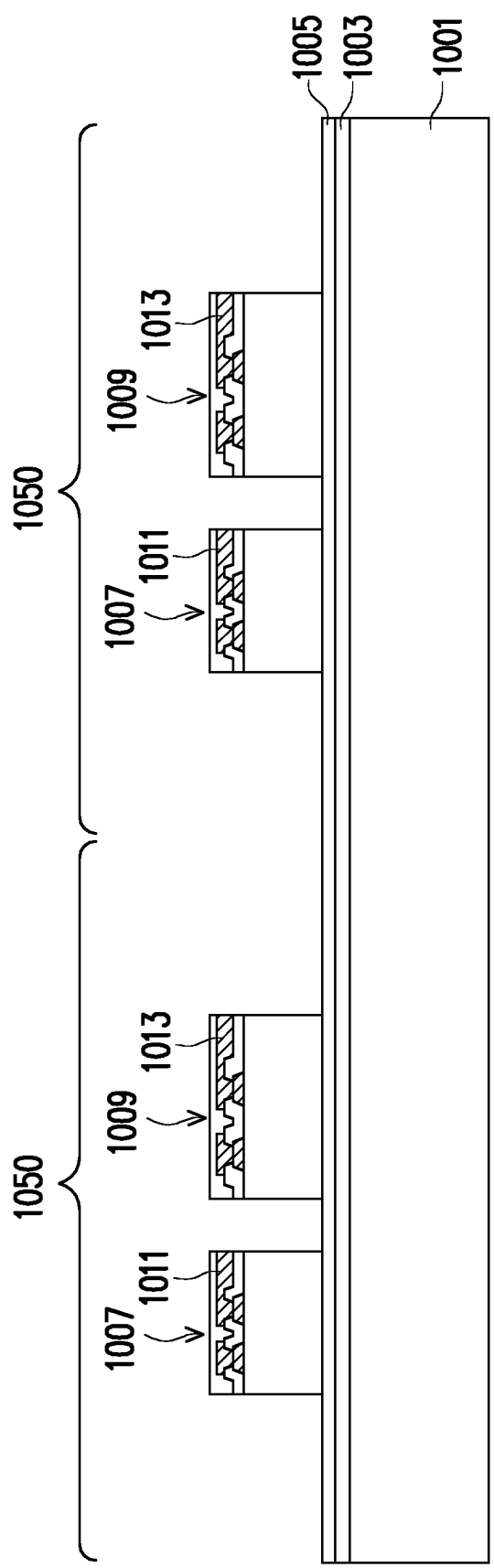
FIGS. 10-14 illustrate formation of InFO structures in accordance with some embodiments.

FIGS. 10-14 show the formation of some embodiments of an InFO structure 1050. The InFO structure 1050 can include one or more semiconductor devices, such as example seventh semiconductor device 1007 and example eighth semiconductor device 1009 shown in FIGS. 10-14. In some embodiments, one semiconductor device or more than two semiconductor devices are placed within each InFO structure 1050. In some embodiments, the one or more semiconductor devices may have a first via or a contact pad with an exposed sidewall, similar to first semiconductor device 101 shown in FIG. 1B and/or second semiconductor device 201 shown in FIG. 2B. For example, seventh semiconductor device 1007 includes a first via 1011 having an exposed sidewall, and eighth semiconductor device 1009 includes a first via 1013 having an exposed sidewall. In some embodiments, one or more of the semiconductor devices is not covered by an EMI film prior to placement within the InFO structure 1050. For example, the seventh semiconductor device 1007 and the eighth semiconductor device 1009 shown in FIG. 10 are not covered by an EMI film.

With reference now to FIG. 10, there is shown a second carrier substrate 1001 with a third adhesive layer 1003 and a second polymer layer 1005. Regions 1050 have been indicated where InFO structures 1050 will be formed. In some embodiments, the second carrier substrate 1001 may be similar to first carrier substrate 301 shown in FIGS. 3-6. For example, the second carrier substrate 1001 may be a material such as those described for first carrier substrate 301.

The third adhesive layer 1003 is formed on the second carrier substrate 1001. In some embodiments, the third adhesive layer 1003 may be similar to the second adhesive layer 303 described previously. The second polymer layer 1005 is placed over the third adhesive layer 1003. In some embodiments, the second polymer layer 1005 may be similar to the first polymer layer 305 described previously. In some embodiments, the seventh semiconductor device 1007 and the eighth semiconductor device 1009 may be placed onto the second polymer layer 1005 using a pick-and-place process. However, any other suitable method of placing semiconductor devices may be used.

Figure 11:
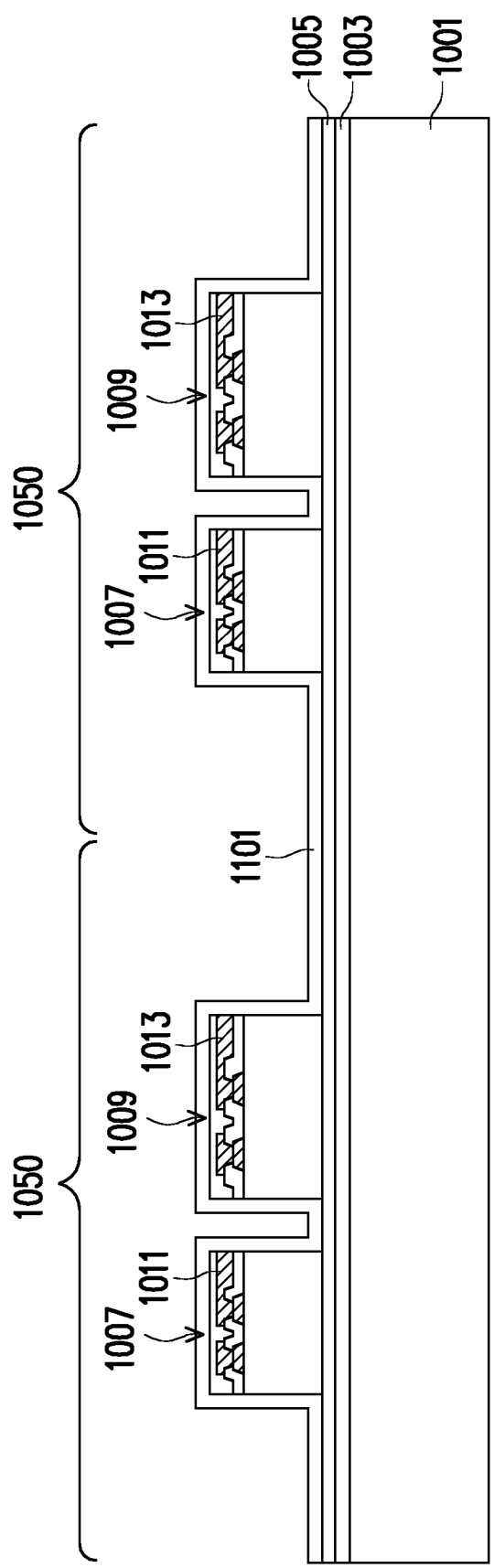

FIG. 11 illustrates a conformal EMI film 1101 formed over the surfaces of the seventh semiconductor device 1007, the eighth semiconductor device 1009, and the second polymer layer 1005. The EMI film 1101 may be similar to EMI film 121 or EMI film 221 described previously. For example, the EMI film 1101 may be formed from a conduction layer formed over an adhesion layer. In some embodiments, the EMI film 1101 is formed from a copper conduction layer formed over a SUS adhesion layer.

As the first via 1011 of the seventh semiconductor device 1007 and the first via 1013 of the eighth semiconductor device 1009 have exposed sidewalls, the EMI film 1101 may make physical contact and electrical contact to the seventh semiconductor device 1007 and the eighth semiconductor device 1009. By electrically connecting the EMI film 1101 to the seventh semiconductor device 1007 and the eighth semiconductor device 1009, the electromagnetic shielding from the EMI film 1101 may be improved.

Figure 12:
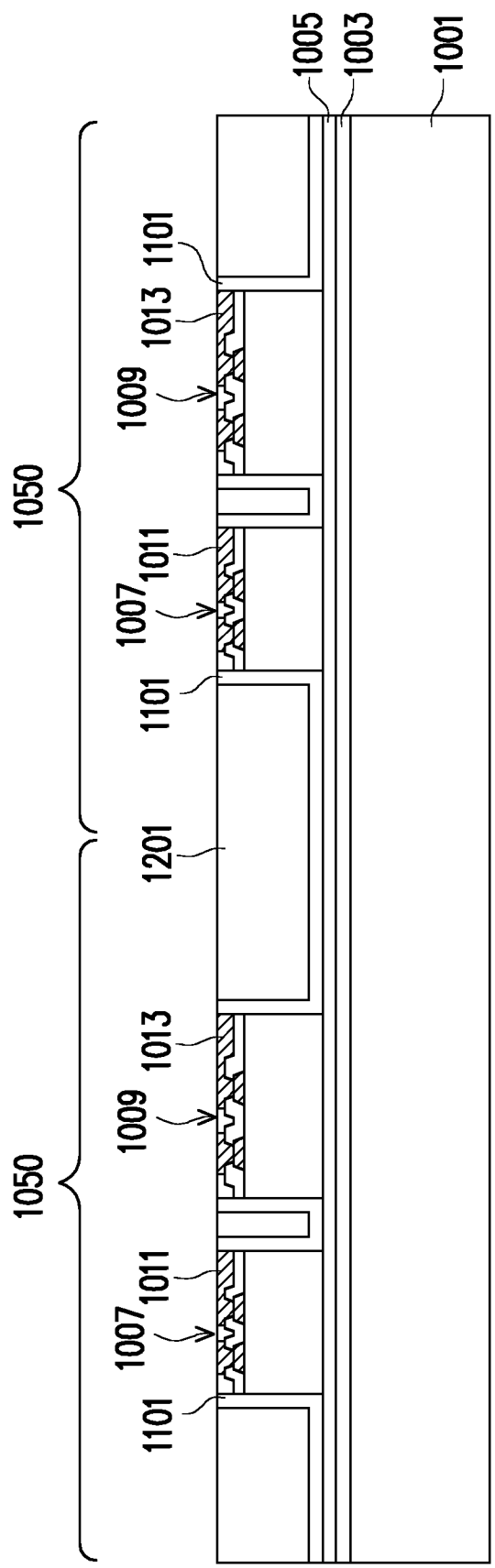

FIG. 12 illustrates an encapsulation and planarization of the seventh semiconductor device 1007 and the eighth semiconductor device 1009. A second encapsulant 1201 may be formed over the seventh semiconductor device 1007 and the eighth semiconductor device 1009 using any suitable method. The second encapsulant 1201 may be a molding compound resin such as polyimide, PPS, PEEK, PES, a heat resistant crystal resin, combinations of these, or the like. In some embodiments, the second encapsulant 1201 is cured after formation.

Figure 13:
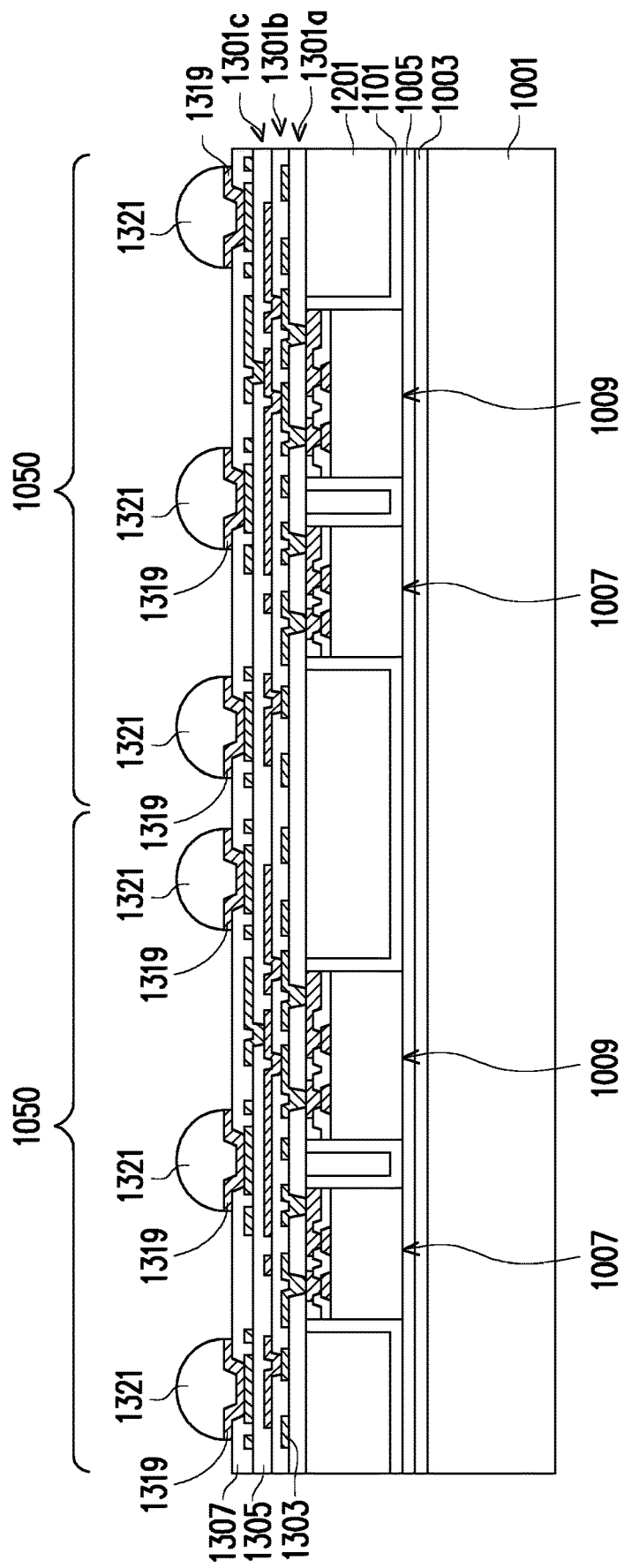
Figure 14:
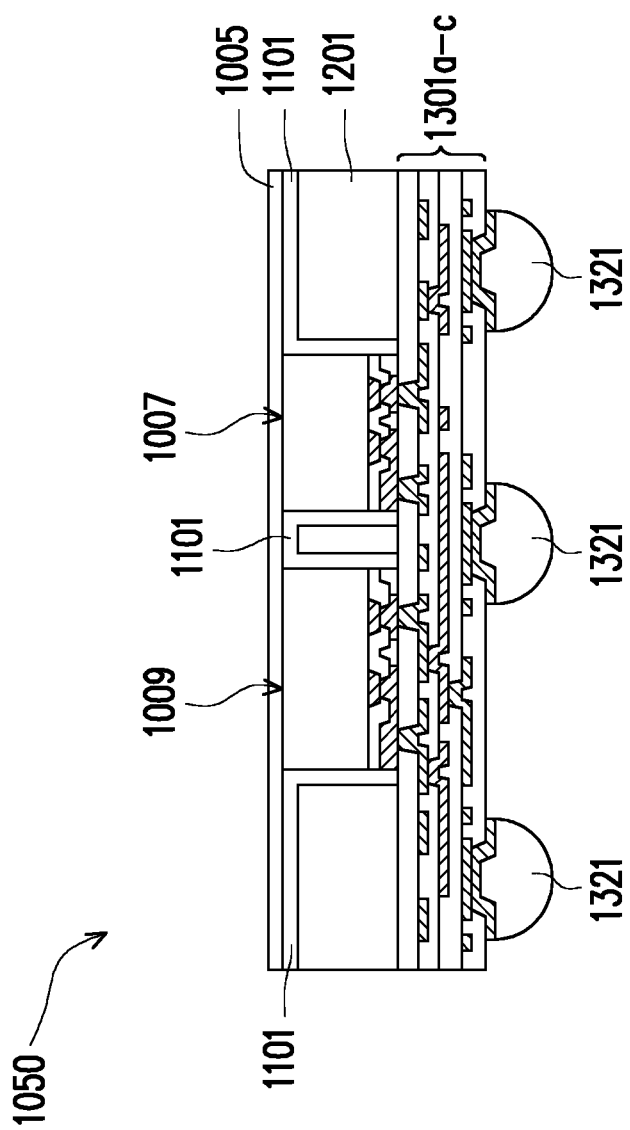

FIG. 12 also illustrates a planarization of the first encapsulant 501. The planarization may be performed using a mechanical grinding process, a chemical mechanical polishing (CMP) process, or another process. In some embodiments, the planarization may grind away the second encapsulant 1201, the top surface of EMI film 1101 over the seventh semiconductor device 1007 and the eighth semiconductor device 1009, and portions of the seventh semiconductor device 1007 and the eighth semiconductor device 1009. The planarization exposes top surfaces of the first via 1011 of the seventh semiconductor device 1007 and the first via 1013 of the eighth semiconductor device 1009 for further processing. As such, the first via 1011 of the seventh semiconductor device 1007 and the first via 1013 of the eighth semiconductor device 1009 may have a planar surface that is also planar with the second encapsulant 1201, as shown in FIG. 12. As shown in FIGS. 12-14, in some embodiments the second encapsulant 1201 covers and protects the EMI film 1101.

FIG. 13 illustrates a formation of redistribution layers (RDL) 1301a-c over the seventh semiconductor device 1007 and the eighth semiconductor device 1009. The RDL 1301a-c shown in FIGS. 13-14 include 3 RDL layers 1301a, 1301b and 1301c, but in other embodiments, the RDLs 1301a-c may include more or fewer RDL layers. In some embodiments, the RDL 1301a-c are formed of alternating layers of dielectric and conductive material and may be formed through any suitable process (such as deposition, damascene, dual damascene, etc.). An example dielectric layer 1305 and an example conductive material layer 1303 are indicated in FIG. 13.

A passivation layer 1307 may be formed over the topmost RDL layer 1301c of RDL 1301a-c. In some embodiments, the passivation layer 1307 may be a polymer such as PBO, a polyimide, a polyimide derivative, or another dielectric material. Openings may be made through the passivation layer 1307 to expose portions of the topmost RDL layer 1301c. The openings in the passivation layer 1307 allow for contact between the topmost RDL layer 1301c and Underbump Metallizations (UBMs) 1319. The openings may be formed using a suitable photolithographic mask and etching process, although any suitable process may be used. The UBMs 1319 may be created by forming one or more conductive layers over the passivation layer 607 and along the interior of the opening through the passivation layer 1307. The external connections 1321 are formed on the UBMs 1319 and may provide external electrical connection points to topmost RDL layer 1301c. The external connections 1321 may be, for example, contact bumps, solder bumps, or another type of connection feature.

FIG. 14 illustrates InFO structure 1050 after singulation. In some embodiments, prior to singulation, the second carrier substrate 1001 may be debonded from the second polymer layer 1005, and the external connections 1321 may be attached to a ring structure, similar to the embodiment shown in FIG. 7. In some embodiments, the second polymer layer 1005 may also be removed (not shown). In some embodiments, a molding compound, encapsulant, dielectric film, semiconductor device, or package may be disposed on the InFO structure 1050 (not shown). In some embodiments, additional electrical connections may be made to portions of the EMI film 1101.

However, as one of ordinary skill in the art will recognize, the above described process to form the InFO structure 1050 is merely one such description, and is not meant to limit the embodiments to this exact process. Rather, the described process is intended to be merely illustrative, as any suitable process for forming and packaging semiconductor devices such as the seventh semiconductor device 1007 and the eighth semiconductor device 1009 may alternatively be utilized. All suitable processes, packages, and structures are fully intended to be included within the scope of the present embodiments.

Figure 15:
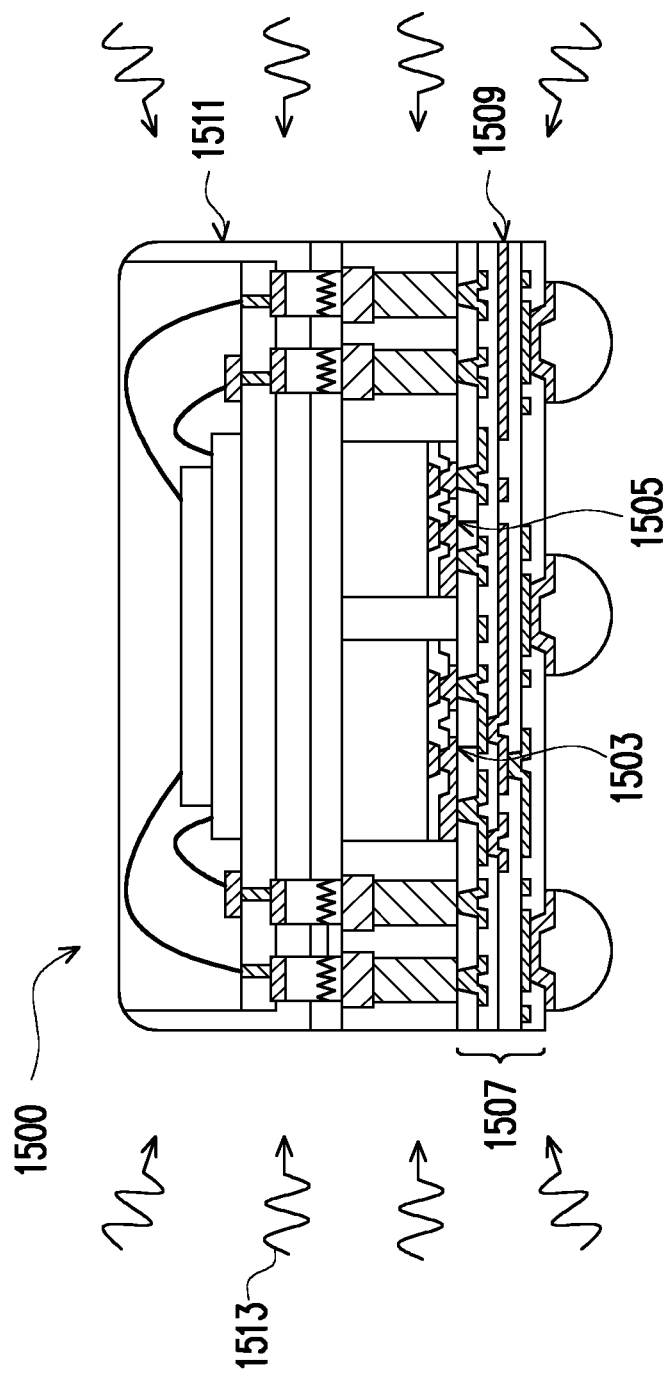
FIGS. 15-16 illustrate formation of an InFO-POP structure with an EMI film in accordance with some embodiments.
Figure 16:
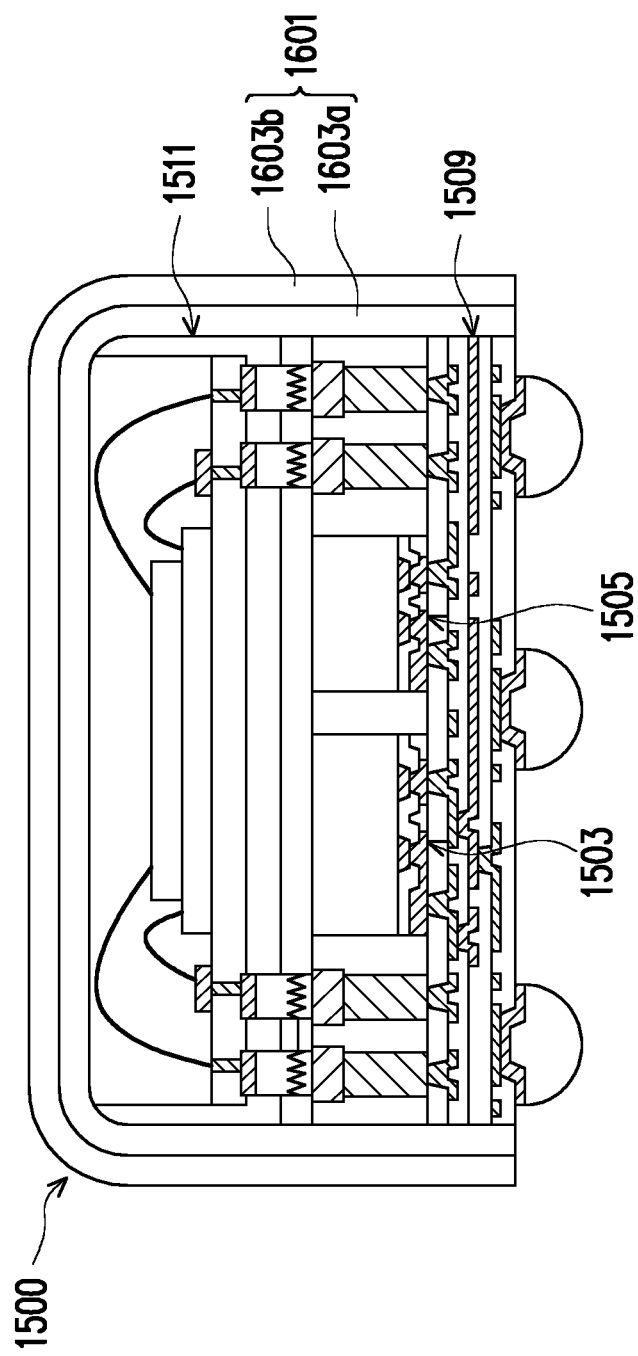

FIGS. 15-16 show the formation of an embodiment of an InFO-PoP structure 1500. In some embodiments, the InFO-PoP structure 1500 may be similar to InFO-PoP structure 350 shown in FIG. 9 and formed by similar processes. For example, the InFO-PoP structure 1500 can include one or more semiconductor devices placed within InFO-PoP structure 1500. The one or more semiconductor devices may be similar to the first semiconductor device 101 shown in FIGS. 1A-1C, the second semiconductor device 201 shown in FIGS. 2A-2C, the seventh semiconductor device 1007 shown in FIGS. 10-14, or the eighth semiconductor device 1009 shown in FIGS. 10-14, though other semiconductor devices may be used in other embodiments. The semiconductor devices may or may not be covered by an EMI film. FIGS. 15-16 show an example ninth semiconductor device 1503 and an example tenth semiconductor device 1505 placed within InFO-PoP structure 1500. In some embodiments, one semiconductor device or more than two semiconductor devices are placed within InFO-PoP structure 1500.

The InFO-PoP structure 1500 includes RDL 1507. In some embodiments, one or more conductive material layers of the RDL 1507 may be exposed at a sidewall of the InFO-PoP structure 1500. An example exposed sidewall 1509 of a conductive material layer of the RDL 1507 is indicated in FIGS. 15-16. The exposed surface 1511 of the InFO-PoP structure 1500 that includes exposed sidewall 1509 is also indicated in FIGS. 15-16. The exposed surface 1511 may include exposed surfaces of molding compound, encapsulant, dielectric layers, conductive layers, or other materials or layers.

FIG. 15 also illustrates a surface preparation process 1513 applied to the exposed surface 1511 of the InFO-PoP structure 1500. The surface preparation process 1513 includes one or more processes that may improve adhesion of a conductive layer that is subsequently formed over portions of the exposed surface 1511. The conductive layer may be part of an EMI film, and an embodiment is described in greater detail below with respect to FIG. 16.

In some embodiments, the surface preparation process 1513 includes an oxygen enrichment treatment and/or a surface roughness treatment. In some embodiments, the oxygen enrichment treatment may include exposing the exposed surface 1511 to an oxygen plasma process. In some embodiments, the oxygen enrichment treatment may include exposing the exposed surface 1511 to a solution containing hydrogen peroxide ($H_2O_2$). In some embodiments, the surface roughness treatment may include exposing the exposed surface 1511 to an argon plasma process. In some embodiments, the surface roughness treatment may include exposing the exposed surface 1511 to an etchant. The surface preparation process 1513 may include one or more of these or other treatments, a combination of treatments, or the like.

FIG. 16 illustrates an EMI film 1601 formed over the exposed surface 1511 of the InFO-PoP structure 1500. In some embodiments, EMI film 1601 is formed from a single conformal layer of material, and in some embodiments, EMI film 1601 is formed from multiple conformal layers of materials. EMI film 1601 is formed over the InFO-PoP structure 1500 to shield the InFO-PoP structure 1500 from electromagnetic interference.

In some embodiments, EMI film 1601 is formed from a conductive layer 1603a and a protection layer 1603b. The conductive layer 1603a is formed conformally over the exposed surface 1511 of the InFO-PoP structure 1500. The conductive layer 1603a may be formed using a suitable technique, for example a deposition process such as sputtering, physical vapor deposition (PVD), chemical vapor deposition (CVD), atomic layer deposition (ALD), spray coating, electroless plating, or the like. In some embodiments, the conductive layer 1603a is a material such as copper, silver, a palladium/copper alloy, or the like. In some cases, the use of surface preparation process 1513 can allow the conductive layer 1603a to adhere to the exposed surface 1511 without a need for an adhesive layer (e.g., an SUS layer or another type of adhesive layer) between the exposed surface 1511 and the conductive layer 1603. In some embodiments, the conductive layer 1603*a* is formed having a thickness of between about 1 µm and about 10 µm, such as about 1 µm.

The protection layer 1603*b* is formed conformally over the conductive layer 1603*a*. The protection layer 1603*b* may be a protective material such as stainless steel (SUS), although any other suitable material, such as nickel, may be used. The protection layer 1603*b* may be deposited by a process such as sputtering, PVD, CVD, ALD, plating, or the like, to a thickness of between about 0.1 µm and about 100 µm, such as about 10 µm.

As the RDL 1507 has an exposed sidewall 1509, the EMI film 1601 may make physical contact and electrical contact to InFO-PoP structure 1500 through the exposed sidewall 1509. In this manner, the EMI film 1601 may be electrically connected to a voltage within the InFO-PoP structure 1500, such as a reference voltage or a ground voltage. In other embodiments, the EMI film 1601 may be connected to the InFO-PoP structure 1500 through multiple exposed sidewalls of the RDL 1507. By electrically connecting the EMI film 1601 to the InFO-PoP structure 1500, the electromagnetic shielding from the EMI film 1601 may be improved. Moreover, by forming the conductive layer 1603*a* directly over the exposed sidewall 1509, the electrical connection between the InFO-PoP structure 1500 and the EMI film 1601 can have a reduced contact resistance. For example, the exposed sidewall 1509 connection to the conductive layer 1603*a* as shown in FIG. 16 may have reduced contact resistance compared with a connection between the exposed sidewall 1509 and an adhesive SUS layer under a conductive layer of an EMI film.

However, as one of ordinary skill in the art will recognize, the above described process to form the EMI film 1601 over the InFO-PoP structure 1500 is merely one such description, and is not meant to limit the embodiments to this exact process. Rather, the described process is intended to be merely illustrative, as any suitable process for forming and packaging semiconductor devices such as the InFO-PoP structure 1500 may alternatively be utilized. All suitable processes, packages, and structures are fully intended to be included within the scope of the present embodiments.

Embodiments of the present disclosure include a semiconductor device covered by an Electromagnetic Interference (EMI) film that shields the device from electromagnetic interference. The semiconductor device may have an internal conductive layer that connects directly to the EMI film. In this manner, the EMI film may be electrically coupled to the semiconductor device, improving the shielding effect of the EMI film. Moreover, the semiconductor device may be incorporated into a package structure such as an InFO structure, an InFO-PoP structure, or another structure. In some cases, covering the semiconductor device with the EMI film eliminates the need to cover the entire package structure with an EMI film, which may reduce the amount of EMI material required, reduce cost, and simplify processing. Additionally, a semiconductor device may be covered by a molding compound or encapsulant within the package structure, in which case the EMI film covering the semiconductor device may not need a protective layer. In this manner, forming an EMI film without a protective layer may also reduce the amount of EMI material required, reduce cost, and simplify processing.

In some embodiments, an EMI film may be formed over a package structure. By performing a surface preparation structure prior to forming the EMI film, an adhesive layer of the EMI film may not be needed. Forming an EMI film without an adhesive layer may also reduce the amount of EMI material required, reduce cost, and simplify processing. Moreover, without the adhesive layer of the EMI film, the package structure may be electrically connected to the conductive layer of the EMI film, which may reduce contact resistance between the package structure and the EMI film.

According to some embodiments, a method includes forming a first semiconductor device, wherein the first semiconductor device includes a top surface and a bottom surface, and wherein the first semiconductor device includes a metal layer having an exposed first surface. The method also includes forming a Electromagnetic Interference (EMI) layer over the top surface and sidewalls of the first semiconductor device, wherein the EMI layer electrically contacts the exposed first surface of the metal layer. The method also includes forming a molding compound over the EMI layer.

According to some embodiments, a method includes forming a package, wherein forming the package includes forming an encapsulant laterally surrounding a first semiconductor device and forming a Redistribution Layer (RDL) over and electrically connected to the first semiconductor device. The method also includes performing a surface preparation process on exposed surfaces of the encapsulant and a portion of the exposed surfaces of the RDL. The method also includes forming an Electromagnetic Interference (EMI) film on an outer surface of the package, wherein the surface preparation process increases adhesion of the EMI film to the package.

According to some embodiments, a structure includes a semiconductor device including a metal layer disposed over a semiconductor substrate, wherein a sidewall of the metal layer is substantially coplanar with a sidewall of the semiconductor substrate. The structure also includes a conductive film disposed over the semiconductor device, wherein the conductive film physically contacts the sidewall of the metal layer and physically contacts the sidewall of the semiconductor substrate, and wherein the conductive film comprises an inner adhesive layer and an outer conduction layer. The structure also includes an encapsulant disposed over and physically contacting the conductive film. The structure also includes a Redistribution Layer (RDL) disposed over and physically contacting the semiconductor device and the encapsulant, wherein the RDL is electrically connected to the metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first semiconductor device and a second semiconductor device on a first substrate;
    forming a first metal layer over and electrically contacting a first semiconductor device, the first metal layer extending into a scribe region between the first semiconductor device and the second semiconductor device, wherein the scribe region extends a first distance from the first semiconductor device to the second semiconductor device, wherein the first metal layer extends a second distance from the first semiconductor device into the scribe region, wherein the second distance is less than the first distance;
after forming the first metal layer, singulating the first semiconductor device and the second semiconductor device, the singulating removing portions of the first metal layer within the scribe region and exposing a sidewall of the first metal layer; and
forming a conductive layer over the top surface and sidewalls of the first semiconductor device, wherein the conductive layer physically contacts the sidewall of the first metal layer and a sidewall of the first semiconductor device.

2. The method of claim 1, wherein the first metal layer is a via layer.

3. The method of claim 1, wherein the first metal layer electrically contacts the first semiconductor device through a contact pad of the first semiconductor device.

4. The method of claim 1, wherein forming the conductive layer comprises:
depositing an adhesion material over the top surface and sidewalls of the first semiconductor device, wherein the adhesion material physically contacts the sidewall of the first metal layer; and
depositing a conduction material over and physically contacting the adhesion material.

5. The method of claim 4, wherein the adhesion material comprises SUS and the conduction material comprises copper.

6. A method comprising:
attaching a semiconductor substrate to a frame;
forming a plurality of semiconductor devices on the semiconductor substrate;
forming a first metal layer on the plurality of semiconductor devices, wherein the first metal layer extends into scribe regions between adjacent semiconductor devices of the plurality of semiconductor devices;
forming a first passivation layer on the first metal layer;
performing a singulation process on the plurality of semiconductor devices, wherein after performing the singulation process, the first metal layer on each semiconductor device has an uncovered first sidewall that is coplanar with a sidewall of each respective semiconductor substrate; and
depositing an Electromagnetic Interference (EMI) film over the plurality of semiconductor devices, the EMI film extending continuously across the scribe regions, the EMI film physically contacting the first sidewall of the first metal layer of each semiconductor device of the plurality of semiconductor devices.

7. The method of claim 6, wherein the EMI film is deposited as a conformal layer.

8. The method of claim 1, wherein forming a conductive layer further comprises forming the conductive layer over the top surface and sidewalls of the second semiconductor device.

9. The method of claim 6, wherein the EMI film is electrically connected to the each semiconductor device of the plurality of semiconductor devices through the first metal layer of each respective semiconductor device.

10. The method of claim 6, wherein attaching the semiconductor substrate to a frame comprises:
attaching a Die Attach Film (DAF) to the frame; and
attaching the semiconductor substrate to the DAF.

11. The method of claim 6, wherein the first metal layer of each semiconductor device of the plurality of semiconductor devices has a second sidewall opposite the uncovered first sidewall that is disposed between opposite sidewalls of the respective semiconductor device.

12. The method of claim 1, wherein the sidewall of the first metal layer is a first sidewall of the first metal layer, wherein the conductive layer over the sidewalls of the first semiconductor device extend along the full length of the first semiconductor device, wherein a top surface of the conductive layer extending between the first semiconductor and the second semiconductor device is closer to the first substrate than a top surface of the conductive layer over the top surface of the first semiconductor device, and further comprising forming a passivation layer on the first metal layer, wherein after forming the passivation layer, the first sidewall of the first metal layer is uncovered and a second sidewall of the first metal layer is covered by and physically contacts the passivation layer.

13. The method of claim 1, wherein the first semiconductor device comprises contact pads, and wherein the first metal layer is formed on the contact pads.

14. The method of claim 6, wherein the EMI film physically contacts the sidewall of the semiconductor substrate along the full length of the sidewall of the semiconductor substrate.

15. The method of claim 6, wherein depositing the EMI film comprises:
forming an adhesive layer over the plurality of semiconductor devices; and
forming a conduction layer over the adhesive layer.

16. The method of claim 15, wherein the adhesive layer comprises SUS.

17. The method of claim 15, wherein the conduction layer comprises copper.

18. The method of claim 6, wherein the first metal layer is a via layer.

19. The method of claim 6, further comprising forming a second passivation layer on the plurality of semiconductor devices, wherein the first metal layer is formed on the second passivation layer.

20. The method of claim 6, wherein a first top surface of the EMI film disposed over the plurality of semiconductor devices is a first distance above the frame, and wherein a second top surface of the EMI film disposed within the scribe regions is a second distance above the frame that is smaller than the first distance.

* * * * *